(12) United States Patent
Kim

(10) Patent No.: US 8,035,427 B2
(45) Date of Patent: Oct. 11, 2011

(54) SIGNAL GENERATING APPARATUS CAPABLE OF MEASURING TRIP POINT OF POWER-UP SIGNAL AND METHOD OF MEASURING TRIP POINT OF POWER-UP SIGNAL USING THE SAME

(75) Inventor: Dong-Kyun Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 149 days.

(21) Appl. No.: 11/819,864

(22) Filed: Jun. 29, 2007

(65) Prior Publication Data

US 2008/0036510 A1 Feb. 14, 2008

(30) Foreign Application Priority Data

Aug. 11, 2006 (KR) ................ 10-2006-0076402

(51) Int. Cl.
*H03L 7/00* (2006.01)
(52) U.S. Cl. ........................................ 327/143
(58) Field of Classification Search .................... 327/77, 327/78, 80, 81, 88, 142, 143, 198, 56
See application file for complete search history.

(56) References Cited

U.S. PATENT DOCUMENTS

| | | | |
|---|---|---|---|
| 5,532,576 A * | 7/1996 | MacRobbie et al. | 323/274 |
| 5,703,512 A * | 12/1997 | McClure | 327/198 |
| 5,739,708 A * | 4/1998 | LeWalter | 327/143 |
| 5,963,079 A * | 10/1999 | Hoang | 327/512 |
| 6,097,659 A | 8/2000 | Kang | |
| 6,275,074 B1 * | 8/2001 | Hastings | 327/74 |
| 6,492,850 B2 * | 12/2002 | Kato et al. | 327/143 |
| 6,642,757 B2 * | 11/2003 | Ikehashi et al. | 327/143 |
| 6,784,718 B2 * | 8/2004 | Okamoto et al. | 327/333 |
| 6,801,060 B2 * | 10/2004 | Ikehashi et al. | 327/80 |
| 6,857,093 B2 * | 2/2005 | Ooishi | 714/733 |
| 6,885,605 B2 | 4/2005 | Lee et al. | |
| 6,937,074 B2 | 8/2005 | Shin | |
| 7,000,040 B2 * | 2/2006 | Senuma | 710/100 |
| 7,075,267 B1 * | 7/2006 | Cheng | 318/807 |
| 7,095,265 B2 * | 8/2006 | Nguyen et al. | 327/293 |
| 7,254,000 B1 * | 8/2007 | Smith et al. | 361/56 |
| 7,403,051 B1 * | 7/2008 | Lesea | 327/143 |
| 7,439,782 B2 * | 10/2008 | Kamoshida | 327/143 |
| 2003/0214329 A1 * | 11/2003 | Shin | 327/143 |
| 2005/0135174 A1 | 6/2005 | Lee et al. | |

FOREIGN PATENT DOCUMENTS

JP 2003203479 7/2003
KR 1020040001196 1/2004

* cited by examiner

*Primary Examiner* — Lincoln Donovan
*Assistant Examiner* — Sibin Chen
(74) *Attorney, Agent, or Firm* — Venable LLP; Jeffri A. Kaminski

(57) ABSTRACT

A signal generating apparatus that is capable of accurately measuring a trip point of a power-up signal without installing a separate measuring instrument is described. An apparatus for generating a signal includes a power-up signal generating unit that generates a power-up signal using an external voltage and a measuring unit that outputs, when the power-up signal is enabled, the comparison result between a voltage generated on the basis of the external voltage and a reference voltage as a trip point.

9 Claims, 4 Drawing Sheets

SIGNAL GENERATING APPARATUS CAPABLE OF MEASURING TRIP POINT OF POWER-UP SIGNAL AND METHOD OF MEASURING TRIP POINT OF POWER-UP SIGNAL USING THE SAME

CROSS-REFERENCE TO RELATED PATENT APPLICATION

This application claims the benefit of Korean Patent Application No. 10-2006-0076402, filed on Aug. 11, 2006, in the Korean Intellectual Property Office, the disclosure of which is incorporated herein in its entirety by reference.

BACKGROUND OF THE INVENTION

1. Technical Field

The present invention relates to a semiconductor integrated circuit, and more particularly, to a signal generating apparatus that is capable of measuring a trip point of a power-up signal and a method of measuring a trip point of a power-up signal using the same.

2. Related Art

In general, a power-up signal as a type of switching signal is a signal that supplies an elevated voltage to a semiconductor integrated circuit.

This power-up signal is generated at the time of applying a voltage to a system to which a semiconductor integrated circuit is applied. That is, the power-up signal is generated by a voltage (hereinafter, referred to as external voltage VDD) that is supplied from the outside. The power-up signal is generated in the signal generating apparatus to which the external voltage VDD is supplied. When the input external voltage has a voltage level that is equal to or higher than a predetermined voltage level, the voltage level of the power-up signal is shifted from a high level to a low level. In this case, the timing when the voltage level of the power-up signal is shifted from the low level to the high level is referred to as a trip point of the power-up signal.

Generally, when the power-up signal is at a low level, the semiconductor integrated circuit performs a reset operation to prepare a normal operation. If the voltage level of the power-up signal is shifted from the low level to the high level, the semiconductor integrated circuit performs a normal operation.

In order to perform a stable operation in a system to which the semiconductor integrated circuit is applied, it is necessary to measure a power-up trip point. That is, the power-up trip point needs to be generated before the semiconductor integrated circuit operates. However, the power-up trip point may be generated during the operation of the semiconductor integrated circuit due to a process variable and a low voltage used. Thus, it is necessary to measure the power-up trip point and perform a trimming operation such that the power-up trip point is generated before the semiconductor integrated circuit operates.

However, when the power-up trip point is measured, each power-up signal generating unit needs to monitor a voltage change corresponding to a time change by using a measuring instrument, such as an oscilloscope. For this reason, a test is complicated and it is difficult to accurately measure the power-up trip point.

SUMMARY OF THE INVENTION

Embodiments of the invention provide a signal generating apparatus that is capable of accurately measuring a trip point of a power-up signal without installing a separate measuring instrument.

Another embodiment of the present invention provides a method of measuring a trip point of a power-up signal in a simple manner.

An embodiment of the present invention provides a signal generating apparatus including a power-up signal generating unit that generates a power-up signal using an external voltage, and a measuring unit that, when the power-up signal is enabled, outputs the comparison result between a voltage generated on the basis of the external voltage and a reference voltage as a trip point.

Another embodiment of the present invention provides a signal generating apparatus including a power-up signal generating unit that generates a power-up signal using an external voltage, and a measuring unit that, when the power-up signal is enabled, outputs the comparison result between a voltage obtained by elevating the external voltage and a reference voltage as a trip point. The measuring unit includes a comparator that compares the elevated voltage and the reference voltage, and a flip-flop that is supplied with an output signal of the comparator as an input signal and is supplied with the power-up signal as a clock signal.

Still another embodiment of the present invention provides a method of driving a signal generating apparatus. The signal generating apparatus includes a power-up signal generating unit that generates a power-up signal using an external voltage and a measuring unit that outputs, when the power-up signal is enabled, the comparison result between a voltage obtained by elevating the external voltage and a reference voltage as a trip point. The method includes gradually reducing a reference voltage applying interval and measuring the trip point.

DESCRIPTION OF EXEMPLARY EMBODIMENT

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
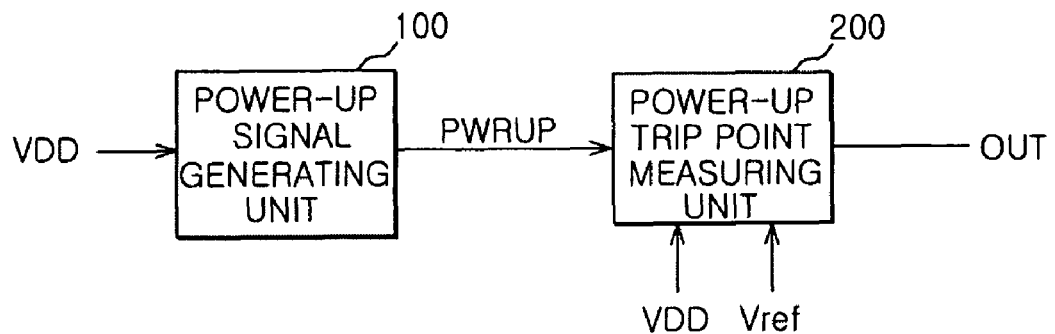
FIG. 1 is a block diagram illustrating a signal generating apparatus including a power-up signal trip point measuring unit according to an embodiment of the present invention.

Referring to FIG. 1, a signal generating apparatus according to an embodiment of the present invention includes a power-up signal generating unit 100 and a power-up trip point measuring unit 200.

Figure 2:
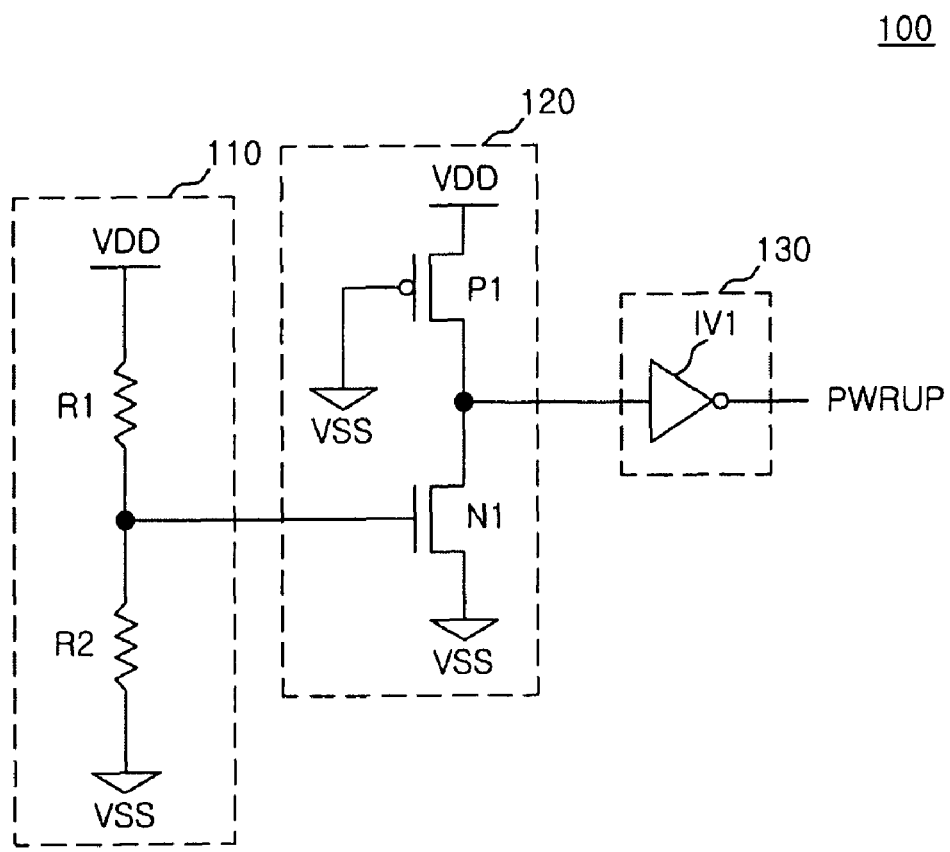
FIG. 2 is a circuit diagram illustrating a detailed structure of a power-up signal generating unit according to an embodiment of the present invention.

When a semiconductor system is turned on, the power-up signal generating unit 100 is supplied with an external voltage VDD and generates a power-up signal PWRUP. When the semiconductor system is turned on, the external voltage VDD is gradually increased with a constant slope, and when a voltage level of the external voltage VDD becomes equal to or higher than a predetermined level, the power-up signal generating unit 100 outputs the power-up signal at a high level. As shown in FIG. 2, the power-up signal generating unit 100 includes a voltage distributing unit 110, a switching unit 120, and an inverter 130. The voltage distributing unit 110 includes a first resistor R1 and a second resistor R2. The first resistor R1 is connected between an input terminal of the external voltage VDD and the second resistor R2, and the second resistor R2 is connected between the first resistor R1 and a ground terminal VSS. The switching unit 120 includes a first PMOS transistor P1 and a first NMOS transistor N1. The first PMOS transistor P1 is turned on according to a ground signal supplied by the ground terminal VSS and transmits the external voltage VDD to a drain of the first PMOS transistor P1. The first NMOS transistor N1 is switched by a voltage supplied from the voltage distributing unit 110, and transmits a drain voltage of the first PMOS transistor P1 to the ground terminal. The inverter 130 inversely amplifies a voltage supplied by the switching unit 120.

Figure 3:
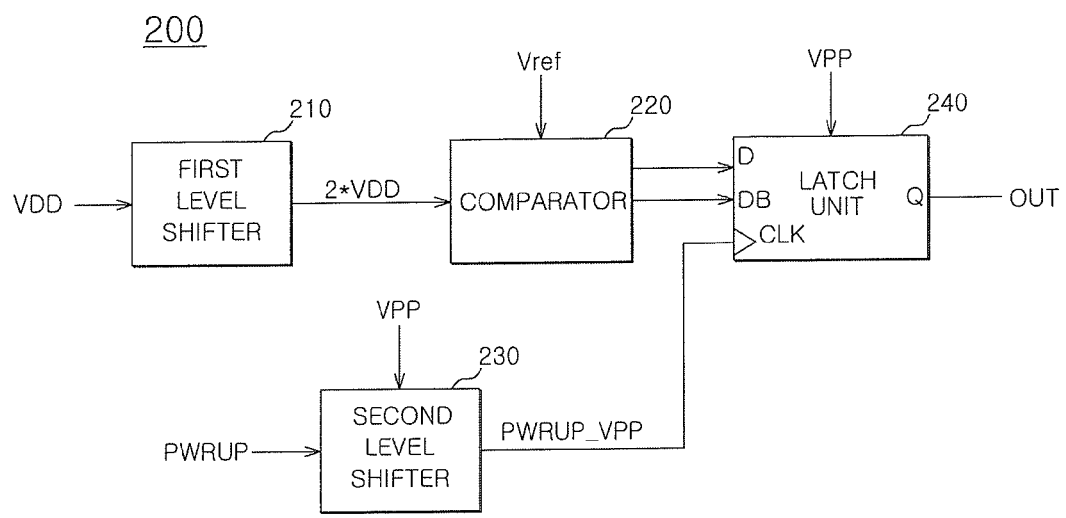
FIG. 3 is a block diagram illustrating a power-up signal trip point measuring unit according to an embodiment of the present invention.
Figure 4:
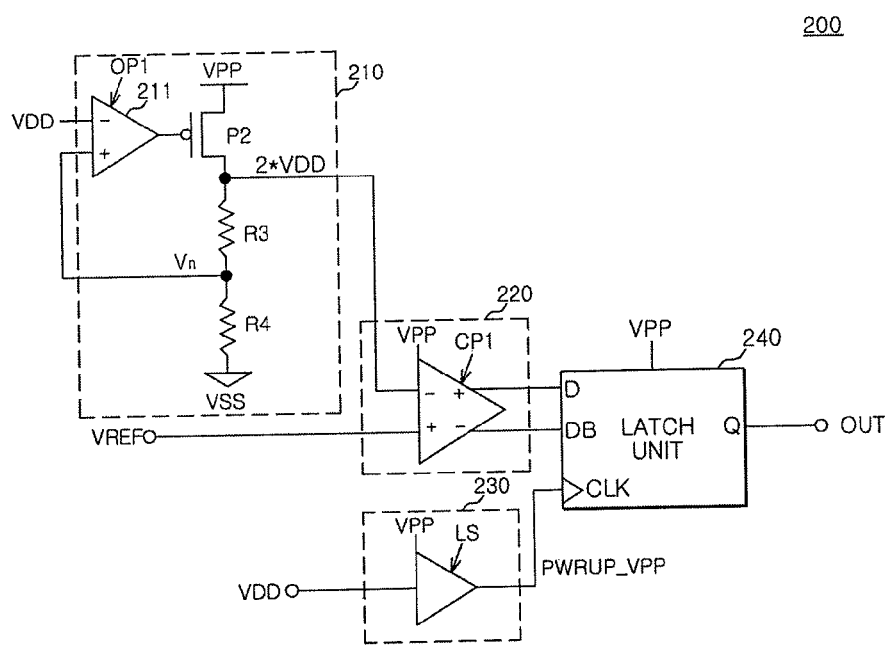
FIG. 4 is a circuit diagram illustrating a detailed structure of a power-up signal trip point measuring unit according to an embodiment of the present invention.

As shown in FIGS. 3 and 4, the power-up trip point measuring unit 200 includes a first level shifter 210, a comparator 220, a second level shifter 230, and a latch unit 240.

The first level shifter 210 elevates a predetermined voltage level of the external voltage VDD to a voltage level of a voltage 2VDD. The first level shifter 210 may include an operational amplifier 211, a second PMOS transistor P2, a third resistor R3, and a fourth resistor R4. The operational amplifier 211 includes a negative input terminal to which the external voltage VDD is input and a positive input terminal to which a voltage at a node between the third and fourth resistors R3 and R4 is input. The second PMOS transistor P2 is turned on by an output signal of the operational amplifier 211 and transmits the external voltage VDD to the third resistor R3. The second PMOS transistor P2 includes a gate that receives the output signal of the operational amplifier 211, a source that is supplied with an elevated potential voltage VPP, and a drain that is connected to the third resistor R3. The third and fourth resistors R3 and R4 are connected in series between the second PMOS transistor P2 and the ground terminal VSS. At this time, the third and fourth resistors R3 and R4 distribute a voltage that is transmitted from the second PMOS transistor P2. In this case, a voltage Vn that is generated at a node between the third and fourth resistors R3 and R4 is supplied to the negative input terminal of the operational amplifier 211.

Figure 6:
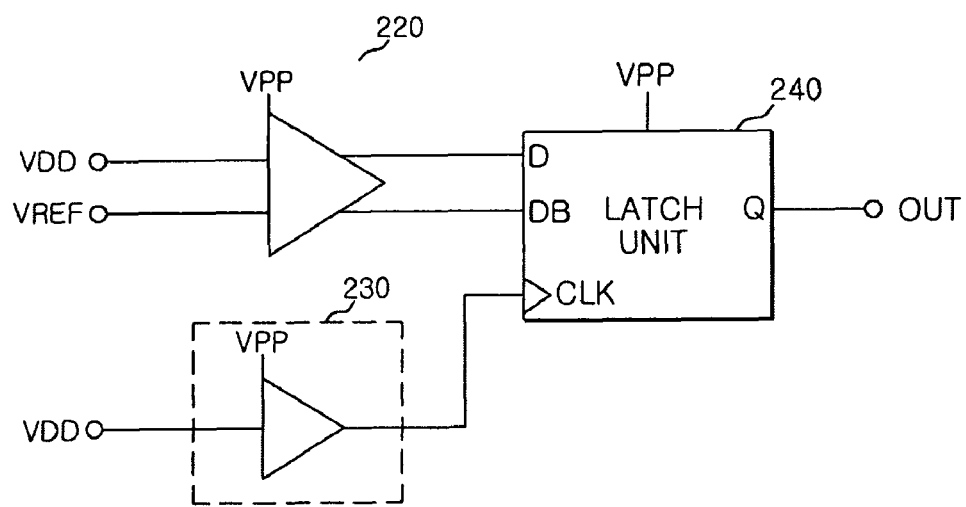
FIG. 6 is a block diagram illustrating a power-up signal trip point measuring unit according to another embodiment of the present invention.

The first level shifter 210 elevates the external voltage VDD to two times as much as the external voltage VDD in order to reduce a measurement error due to an offset of the comparator 220. As shown in FIG. 6, however, the external voltage VDD maybe input to the comparator 220 without installing the first level shifter 210.

The comparator 220 compares an output voltage of the first level shifter 210 (or external voltage VDD in an example of FIG. 6) and a reference voltage Vref. When the output voltage of the first level shifter 210 is smaller than the reference voltage Vref, the comparator 220 outputs a low signal, and when the output voltage of the first level shifter 210 is larger than the reference voltage Vref, the comparator 210 outputs a high signal.

The second level shifter 230 elevates a voltage level of the power-up generating signal PWRUP supplied by the power-up signal generating unit 100 to a predetermined level, for example, an elevated potential level VPP. The second level shifter 230 may have the same structure as the first level shifter 210.

The latch unit 240 outputs a high signal at a point of time when a voltage level of the output signal PWRUP_VPP of the second level shifter 230 is converted. The latch unit 240 may be a flip-flop, for example, a D flip-flop. When the latch unit 240 is composed of the D flip-flop, the output signal of the comparator 220 is input to a D input terminal of the latch unit 240, a signal that is obtained by inverting the output signal of the comparator 220 is input to a DB input terminal of the latch unit 240, and the output signal PWRUP_VPP of the second level shifter 230 is input to a clock input terminal CLK of the comparator 220. It is preferable that the latch unit 240 composed of the flip-flop be driven by the elevated potential voltage VPP. The flip-flop should be supplied with a constant driving voltage so as to perform a normal operation. For this reason, the flip-flop is supplied with the elevated potential voltage VPP that has a voltage level that is more stable than the external voltage VDD. At this time, since the latch unit 240 is driven with the elevated potential voltage VPP, the second level shifter 230 needs to elevate the voltage level of the power-up signal PWRUP to the voltage level of the elevated potential voltage VPP. In this case, the elevated potential voltage VPP means a voltage that is generated by pumping the external voltage VDD and has a higher voltage level than the external voltage VDD.

The operation of a circuit for measuring a trip point of a power-up signal according to an embodiment of the present invention that has the above-described structure will now be described.

First, the external voltage VDD is applied to the first level shifter 210. That is, the external voltage VDD and the voltage Vn at the connecting node between the third and fourth resistors R3 and R4 are applied to the operational amplifier 211 such that the operational amplifier 211 outputs a signal having a negative voltage level, thereby turning on the second PMOS transistor P2. Therefore, the first level shifter 210 outputs the elevated potential voltage VPP that corresponds to the voltage 2*VDD.

The output signal of the first level shifter 210 is input to the comparator 220. The comparator 220 compares the voltage 2*VDD as the output signal of the first level shifter 210 and the reference voltage Vref, and outputs a high signal when the voltage 2*VDD is larger than the reference voltage Vref and outputs a low signal when the voltage 2*VDD is smaller than the reference voltage Vref.

Meanwhile, the second level shifter 230 elevates the voltage level of the power-up signal PWRUP to the elevated potential voltage VPP.

A positive output signal and a negative output signal of the comparator 220 and the output signal of the second level shifter 230 are respectively input to the D input terminal, the DB input terminal, and the CLK input terminal of the D flip-flop that constitutes the latch unit 240. The D flip-flop outputs a signal that is input to the D input terminal at a point of time when the elevated power-up signal PWRUP_VPP input to the clock terminal CLK is shifted to a low level to the high level, that is, the positive output signal of the comparator 220.

At this time, the point of time when the elevated power-up signal PWRUP_VPP is shifted from the low level to the high level, that is, the trip point is measured by varying the reference voltage Vref that is input to the comparator 220.

Figure 7:
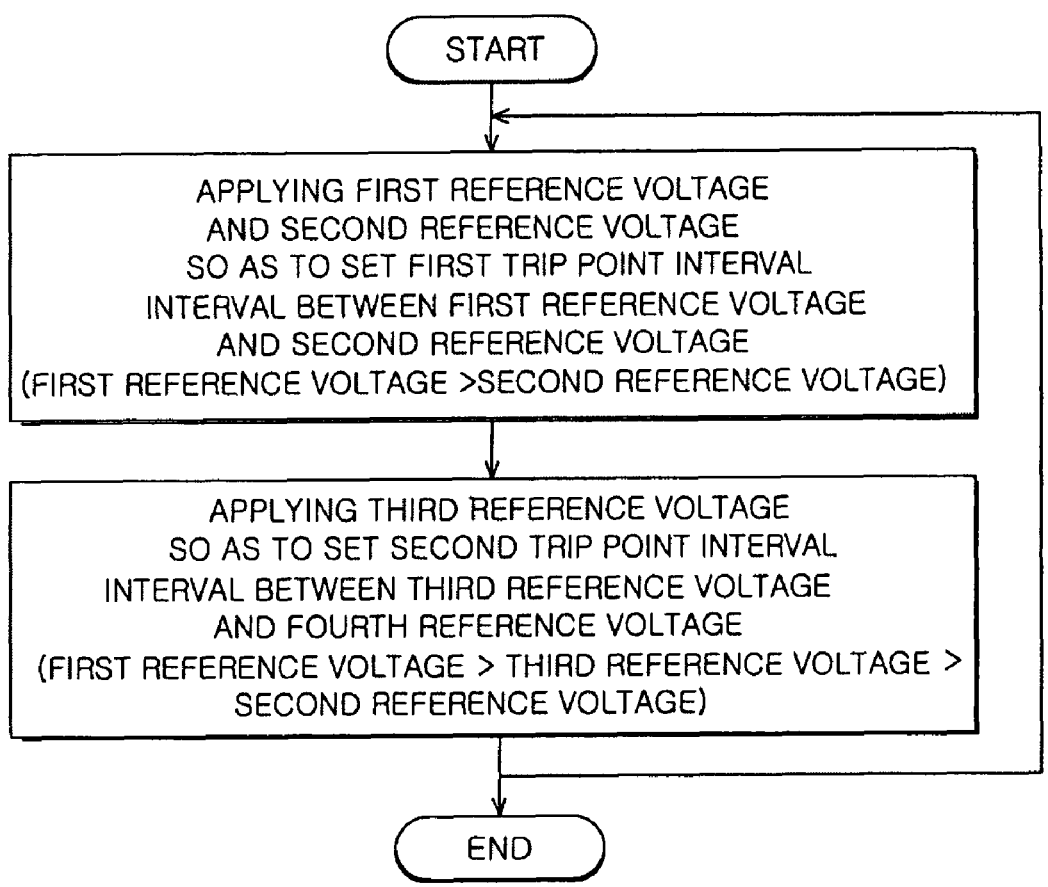
FIG. 7 is a flowchart illustrating a method of measuring a trip point of a power-up signal according to an embodiment of the present invention.

Referring to FIG. 7, when the reference voltage Vref is a first voltage, for example, 3.4 V, the latch unit 240 outputs a low signal, and when the reference voltage Vref is a second voltage, for example, 3 V, the latch unit 240 outputs a high signal. In this case, a first trip point interval becomes a voltage interval 3.0 to 3.4 V between the first voltage and the second voltage.

In order to accurately obtain a trip point, when applying a third reference voltage 3.2 V, which is an average voltage between the first reference voltage and the second reference voltage, as the reference voltage Vref, if the latch unit 240 outputs a high signal, a second trip point interval becomes a voltage interval 3.2 to 3.4 V between the first voltage and the third voltage.

If the above-described operation is repeated, a reference voltage applying interval is gradually reduced, which finds an accurate trip point interval of a power-up signal. At this time, since a trip point level of the power-up signal is obtained when the voltage 2*VDD is input to the comparator 220, an actual trip point level of a power-up signal corresponds to half a trip point level of a power-up signal that is obtained from the output of the D flip-flop.

Figure 5:
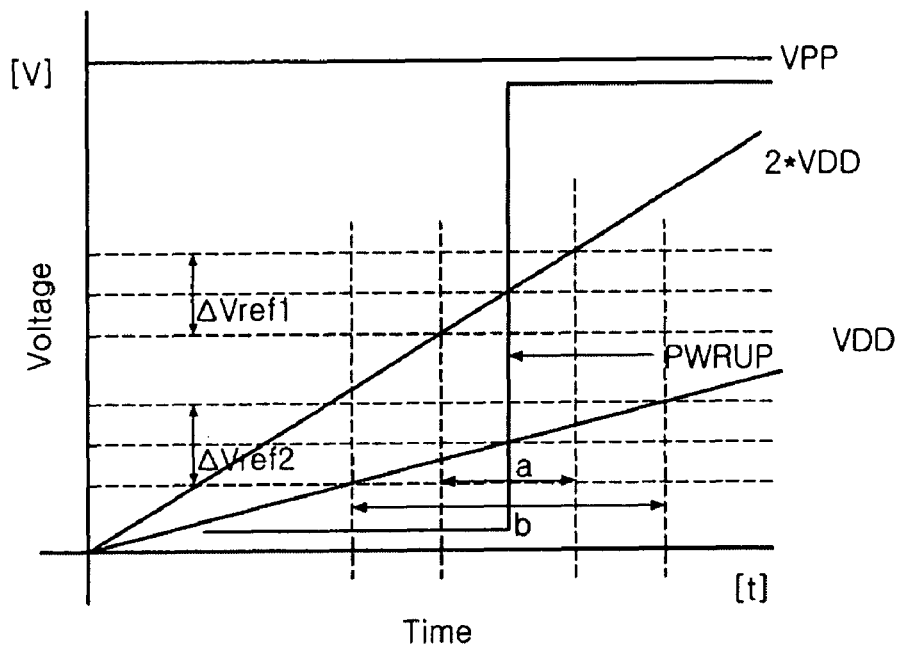
FIG. 5 is a graph illustrating the result that is measured by a power-up signal trip point measuring unit according to an embodiment of the present invention.

FIG. 5 is a graph illustrating the result that is measured by a power-up signal trip point measuring unit according to an embodiment of the present invention.

As shown in FIG. 5, the external voltage VDD is increased with a constant slope. If the external voltage VDD is applied to the comparator 220, a measurement error that corresponds to a "b" interval occurs in the power-up signal trip point.

Meanwhile, if the voltage 2*VDD is applied to the comparator 220, a measurement error that corresponds to a "a" interval occurs in the power-up signal trip point.

The measurement error occurs due to an offset voltage ΔV of the comparator 220, and may be inversely proportional to the voltage applied to the comparator 220.

That is, since the comparator 220 has the offset, it is preferable to use the voltage 2*VDD rather than the external voltage VDD in order to accurately obtain a power-up signal trip point. If the rising rate of the external voltage VDD (gradual slope of the external voltage VDD) that is applied to the comparator 220 is increased, it is possible to more accurately measure the power-up signal trip point.

In this embodiment, the first level shifter 210 is designed to output the voltage 2*VDD, but the present invention is not limited thereto. That is, the first level shifter 210 may be designed to output a voltage three times larger than the external voltage VDD or more.

In this embodiment, the power-up signal trip point measuring unit has been exemplified. However, the present invention is not limited thereto, and may be applied to all signals where trip points need to be measured.

It will be apparent to those skilled in the art that various modifications and changes may be made without departing from the scope and spirit of the invention. Therefore, it should be understood that the above embodiments are not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

What is claimed is:

1. A signal generating apparatus comprising:
   a power-up signal generating unit configured to only receive an external voltage as an input signal, and generate a power-up signal in response to the external voltage;
   a measuring unit configured to latch a comparison result between a voltage generated on the basis of the external voltage and a reference voltage when the power-up signal is disabled, output the comparison result, as a trip point, when the power-up signal is enabled, and find a voltage corresponding to the trip point; and
   a level shifter between the power-up signal generating unit and the measuring unit that raises the power-up signal,
   wherein the reference voltage is a variable voltage,
   wherein the measuring unit further comprises another level shifter that generates a voltage that is multiple times larger than the external voltage.

2. The signal generating apparatus of claim 1,
   wherein the measuring unit includes:
   a comparator that compares the voltage generated on the basis of the external voltage and the reference voltage to output the comparison result; and
   a latch unit that stores the comparison result of the comparator and outputs the comparison result of the comparator while a voltage level of the power-up signal is transmitted from a low level to a high level.

3. The signal generating apparatus of claim 2,
   wherein the voltage that is generated on the basis of the external voltage is a substantial external voltage.

4. The signal generating apparatus of claim 2,
   wherein the voltage that is generated on the basis of the external voltage is the voltage that is multiple times larger than the external voltage.

5. The signal generating apparatus of claim 2,
   wherein the latch unit is a flip-flop that has an input terminal receiving the comparison result of the comparator and a clock terminal receiving the power-up signal.

6. The signal generating apparatus of claim 5,
   wherein the flip-flop is driven by an elevated potential voltage.

7. A signal generating apparatus comprising:
   a power-up signal generating unit that only receives an external voltage as an input signal, and generates a power-up signal in response to the external voltage; and
   a measuring unit that latches a comparison result between a voltage obtained by elevating the external voltage to obtain an elevated voltage and a reference voltage having variable values when the power-up signal is disabled, and outputs the comparison result, as a trip point, when the power-up signal is enabled,
   wherein the measuring unit includes a comparator that compares the elevated voltage and the reference voltage to produce the comparison result, and a flip-flop that is supplied with the comparison result of the comparator as an input signal and is supplied with the power-up signal as a clock signal,
   wherein the comparison result represents whether voltage obtained by elevating the external voltage is higher than the reference voltage,
   wherein the measuring unit further comprises a level shifter that generates the elevated voltage.

8. The signal generating apparatus of claim 7,
   wherein the elevated voltage is a voltage that is multiple times larger than the external voltage.

9. The signal generating apparatus of claim 7, further comprising:
   a level shifter between the power-up signal generating unit and the measuring unit that raises the power-up signal.

* * * * *